(12) United States Patent
Kajita et al.

(10) Patent No.: US 7,578,887 B2
(45) Date of Patent: Aug. 25, 2009

(54) APPARATUS FOR AND METHOD OF PROCESSING SUBSTRATE

(75) Inventors: Shinji Kajita, Tokyo (JP); Ichiro Katakabe, Tokyo (JP); Haruko Ono, Tokyo (JP); Yuki Inoue, Tokyo (JP); Sachiko Takeda, Tokyo (JP)

(73) Assignee: Ebara Corporation, Tokyo (JP)

( * ) Notice: Subject to any disclaimer, the term of this patent is extended or adjusted under 35 U.S.C. 154(b) by 575 days.

(21) Appl. No.: 10/765,182

(22) Filed: Jan. 28, 2004

(65) Prior Publication Data

US 2004/0211959 A1     Oct. 28, 2004

(30) Foreign Application Priority Data

Jan. 28, 2003     (JP)     ............... 2003-018792

(51) Int. Cl.
*B08B 3/00*     (2006.01)
(52) U.S. Cl. .............................. 134/26; 134/18; 134/33; 134/42
(58) Field of Classification Search ................ 134/94.1, 134/95.1, 95.3, 99.1, 103.2, 104.1, 137, 140, 134/151, 198, 199, 902, 22.1, 22.18, 34, 134/36, 18, 26, 32, 33, 42; 118/52, 70, 320, 118/500, 501, 504
See application file for complete search history.

(56) References Cited

U.S. PATENT DOCUMENTS

| | | | |
|---|---|---|---|
| 5,252,137 A * | 10/1993 | Tateyama et al. | 134/34 |
| 5,634,980 A * | 6/1997 | Tomita et al. | 134/3 |
| 5,826,130 A * | 10/1998 | Tanaka et al. | 396/611 |
| 5,945,161 A * | 8/1999 | Hashimoto et al. | 427/240 |
| 6,090,534 A * | 7/2000 | Costigan et al. | 430/329 |
| 6,192,903 B1 * | 2/2001 | Doi et al. | 134/149 |
| 6,265,328 B1 | 7/2001 | Henley et al. | |
| 6,413,436 B1 | 7/2002 | Aegerter et al. | |
| 6,432,199 B1 * | 8/2002 | Takekuma | 118/52 |
| 6,705,331 B2 * | 3/2004 | Sato et al. | 134/99.1 |
| 6,843,259 B2 * | 1/2005 | Nagamine | 134/94.1 |
| 6,945,259 B2 * | 9/2005 | Masui et al. | 134/56 R |

FOREIGN PATENT DOCUMENTS

| | | | |
|---|---|---|---|
| JP | 6-106126 | * | 4/1994 |
| JP | 10-172945 | * | 6/1998 |

* cited by examiner

*Primary Examiner*—Michael Barr
*Assistant Examiner*—Jason Heckert
(74) *Attorney, Agent, or Firm*—Wenderoth, Lind & Ponack, L.L.P.

(57) ABSTRACT

An apparatus for processing a substrate through successive steps including spin-drying the substrate with a single processing facility while preventing the substrate from being contaminated by a substrate processing liquid, etc. The apparatus for processing a substrate includes a substrate holder for holding and rotating a substrate, a scattering prevention cup for circumferentially surrounding the substrate held by the substrate holder to prevent a substrate processing liquid supplied to the substrate from being scattered around, and a scattering prevention cup cleaner for cleaning an inner wall surface of the scattering prevention cup.

1 Claim, 4 Drawing Sheets

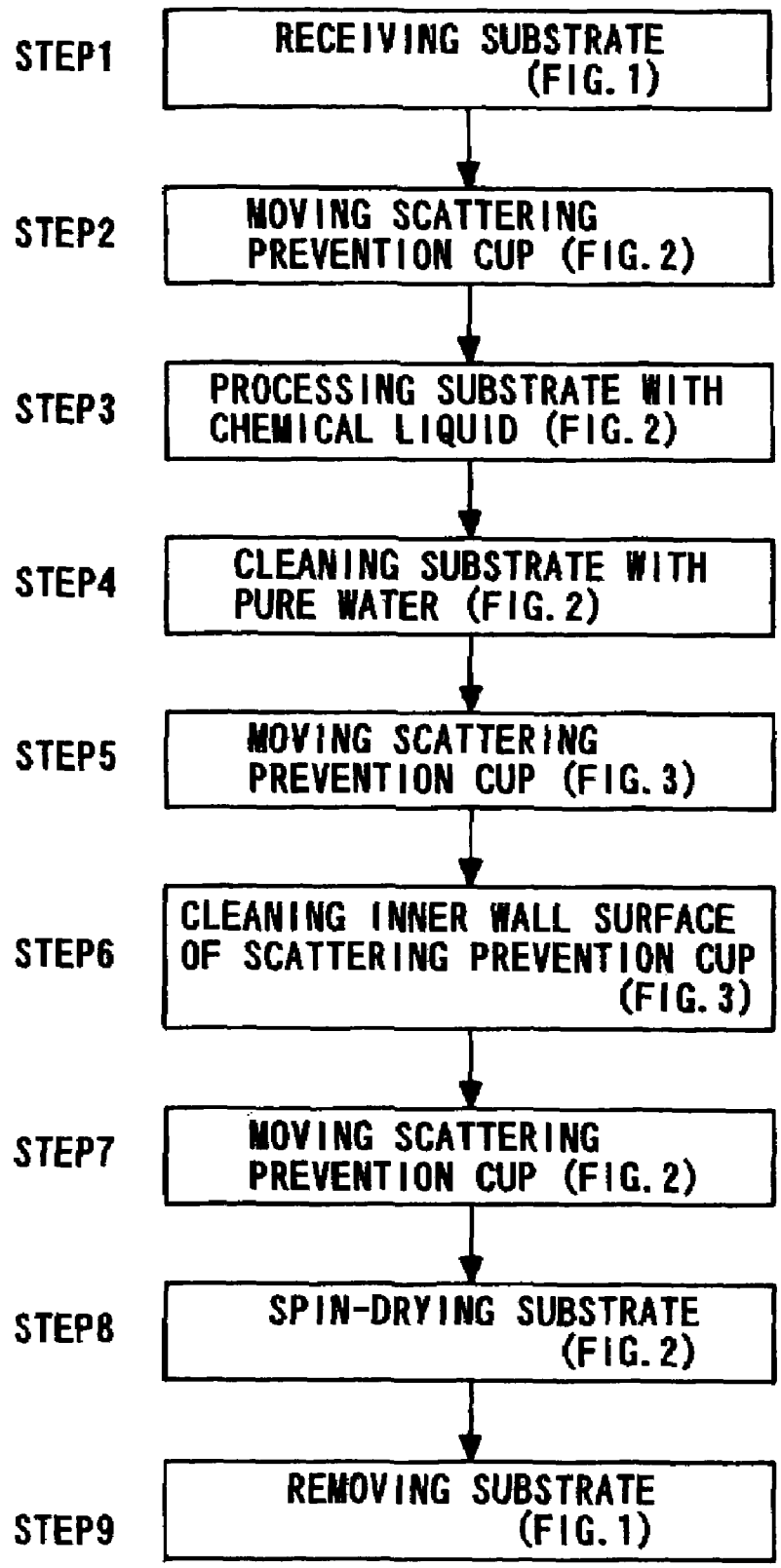

APPARATUS FOR AND METHOD OF PROCESSING SUBSTRATE

BACKGROUND OF THE INVENTION

1. Field of the Invention

The present invention relates to an apparatus for and a method of processing a substrate such as a semiconductor wafer of the like at a time, and more particularly to an apparatus for and a method of processing a substrate by successively processing the substrate with a chemical liquid, cleaning the processed substrate with pure water or the like, and spin-drying the cleaned substrate.

2. Description of the Related Art

Heretofore, it has been customary to process a substrate by successively processing the substrate with a chemical liquid, cleaning the processed substrate with pure water or the like, and spin-drying the cleaned substrate with an apparatus which treats the substrate with the chemical liquid and cleans the processed substrate, and another separate apparatus which spin-dries the cleaned substrate. The separate apparatus have been used because if the successive processing steps are performed by one apparatus, then a substrate processing liquid such as a chemical liquid tends to be splashed back onto the substrate or turned into a mist which adversely affects a film on or a processed surface of the substrate when the substrate is spin-dried.

Specifically, the substrate is liable to be contaminated by a substrate processing liquid which is splashed back after it is expelled from the substrate or a substrate holder that holds the substrate, a substrate processing liquid which is splashed back from collision with the substrate processing liquid that has been deposited on the inner wall surface of a scattering prevention cup after it is expelled from the substrate or the substrate holder that holds the substrate, and a substrate processing liquid mist that is produced when the substrate processing liquid referred to above is splashed back. While the substrate is being spin-dried, in particular, the surface of the substrate is exposed and easily susceptible to the splashed-back substrate processing liquid, the mist, etc.

The conventional practice to use the separate apparatus for processing the substrate with the chemical liquid and cleaning the processed substrate with pure water or the like, and spin-drying the cleaned substrate has been disadvantageous in that the substrate being processed tends to suffer increased footprints, and the need for transferring the substrate between the apparatuses results in a reduction in the throughput. For this reason, there has been a demand for a single apparatus that is capable of successively processing a substrate through various steps including spin-drying the substrate.

SUMMARY OF THE INVENTION

It is therefore an object of the present invention to provide an apparatus for and a method of processing a substrate through successive steps including spin-drying the substrate with a single processing facility while preventing the substrate from being contaminated by a substrate processing liquid, a mist, etc.

According to a first aspect of the present invention, there is provided an apparatus for processing a substrate, comprising a substrate holder for holding and rotating a substrate, a scattering prevention cup for circumferentially surrounding the substrate held by the substrate holder to prevent a substrate processing liquid supplied to the substrate from being scattered around, and a scattering prevention cup cleaner for cleaning an inner wall surface of the scattering prevention cup.

The inner wall surface of the scattering prevention cup is cleaned to remove the substrate processing liquid, such as chemical liquid, applied to the inner wall surface. Therefore, the substrate is prevented from being contaminated by the substrate processing liquid that has been applied to the inner wall surface of the scattering prevention cup when the substrate is dried.

Preferably, the scattering prevention cup is vertically movable between a lower substrate transfer position, an upper scattering prevention position, and a cleaning position between the lower substrate transfer position and the upper scattering prevention position.

The scattering prevention cup cleaner may be arranged to clean the inner wall surface of the scattering prevention cup with a cleaning liquid supplied to the substrate.

The substrate and the inner wall surface of the scattering prevention cup can thus be cleaned by the same substrate processing liquid, which may be pure water, for example.

According to a second aspect of the present invention, there is provided an apparatus for processing a substrate, comprising a substrate holder for holding and rotating the substrate, and a substrate holder cleaner for cleaning the substrate holder.

The substrate holder is cleaned to remove a substrate processing liquid, such as a chemical liquid, that is applied to the substrate holder. The substrate is thus prevented from being contaminated by the substrate processing liquid that has been applied to the substrate holder when the substrate is dried.

The substrate holder cleaner may comprise a plurality of cleaning liquid supply nozzles.

In the preferred embodiment of the invention, further comprises a scattering prevention cup for circumferentially surrounding the substrate held by said substrate holder to prevent a substrate processing liquid supplied to the substrate from being scattered around, wherein at least one of the cleaning liquid supply nozzles being mounted on the scattering prevention cup.

At least one of the cleaning liquid supply nozzles serving as a substrate holder cleaner can be vertically moved in unison with the scattering prevention cup without the need for any dedicated mechanism for vertically moving the cleaning liquid supply nozzle.

According to a third aspect of the present invention, there is provided an apparatus for processing a substrate, comprising a substrate holder for holding and rotating the substrate, a processing liquid supply portion for supplying a substrate processing liquid to the substrate held by the substrate holder, and a processing liquid supply portion cleaner for cleaning the processing liquid supply portion.

The processing liquid supply portion is cleaned to remove the substrate processing liquid, such as a chemical liquid, that has been applied to the processing liquid supply portion. Therefore, the substrate is prevented from being contaminated by the substrate processing liquid that has been applied to the processing liquid supply portion when the substrate is dried.

According to a fourth aspect of the present invention, there is provided a method of processing a substrate, comprising, processing the substrate with a chemical liquid, cleaning at least one of a substrate holder for holding and rotating the substrate, an inner wall surface of a scattering prevention cup for circumferentially surrounding the substrate held by the substrate holder to prevent a substrate processing liquid supplied to the substrate from being scattered around, and a processing liquid supply for supplying a substrate processing liquid to the substrate held by the substrate holder, and then cleaning the substrate which has been processed by the chemical liquid.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 4 is a flowchart of a sequence for processing a substrate with the substrate processing apparatus shown in FIGS. 1 through 3.

DETAILED DESCRIPTION OF THE PREFERRED EMBODIMENTS

Preferred embodiments of the present invention will now be described in detail with reference to the drawings.

Figure 1:
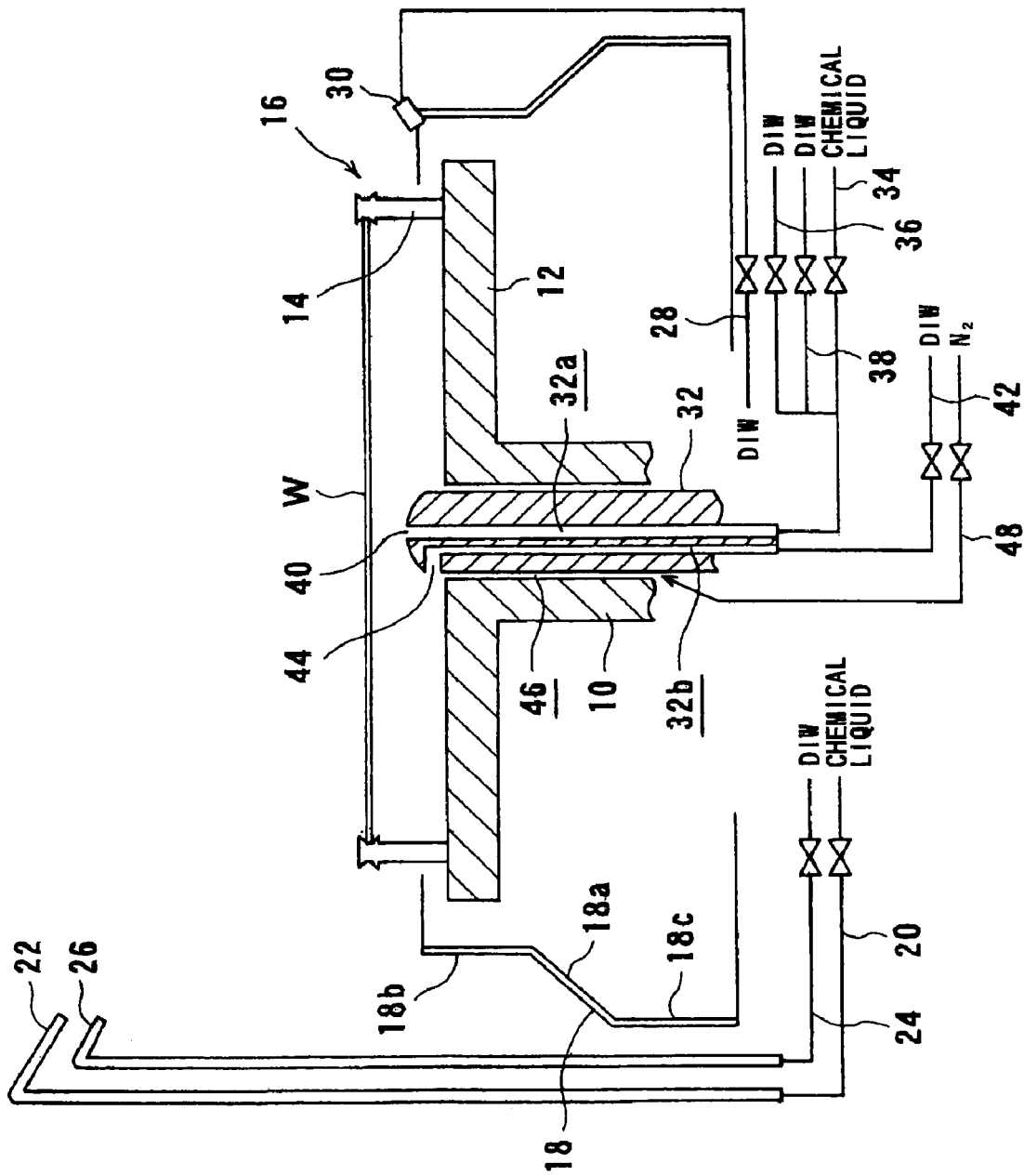
FIG. 1 is a schematic cross-sectional view of a substrate processing apparatus according to an embodiment of the present invention, with a scattering prevention cup in a lower substrate transfer position.
Figure 2:
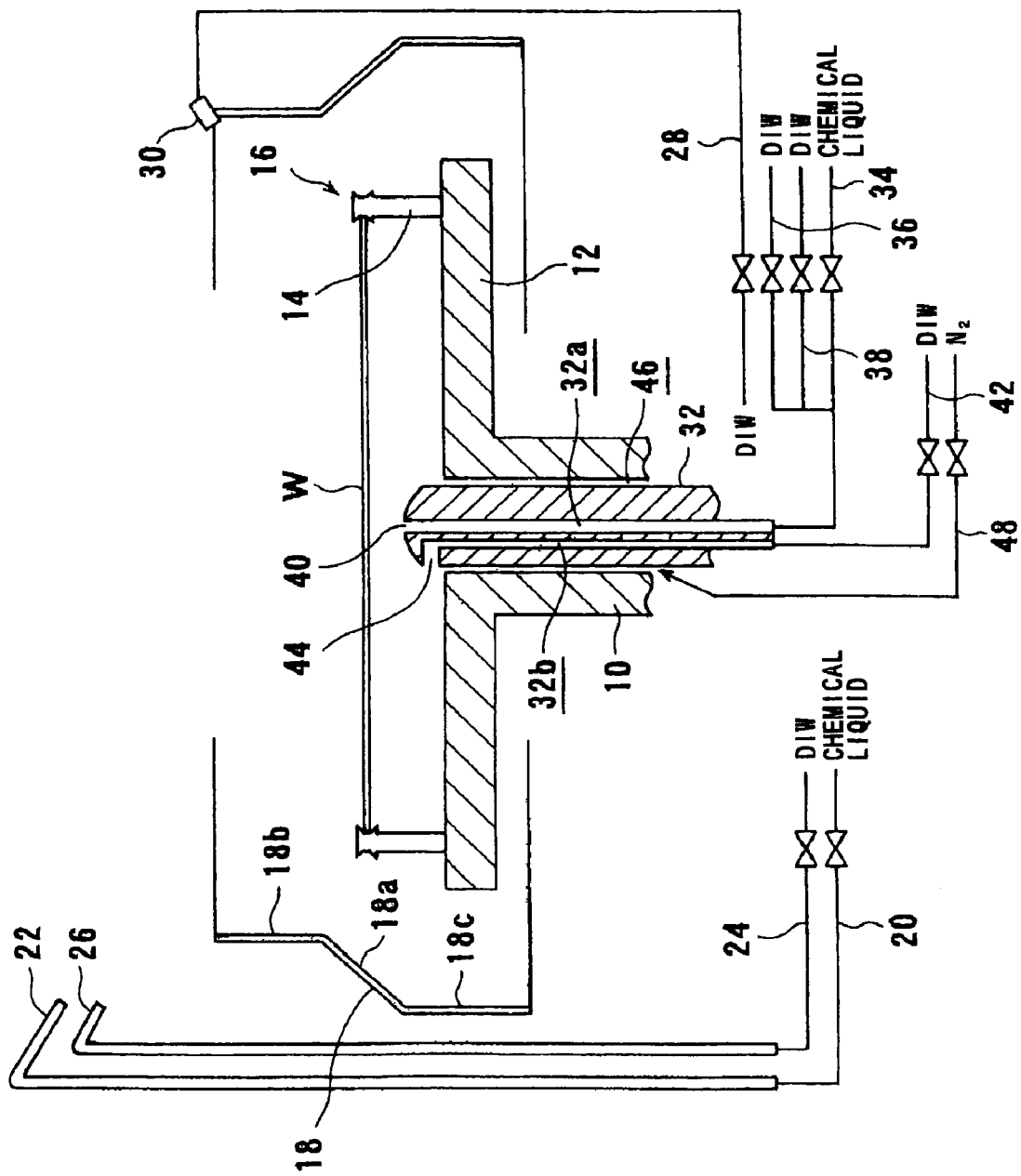
FIG. 2 is a schematic cross-sectional view of the substrate processing apparatus according to the embodiment of the present invention, with the scattering prevention cup in an upper scattering prevention position.
Figure 3:
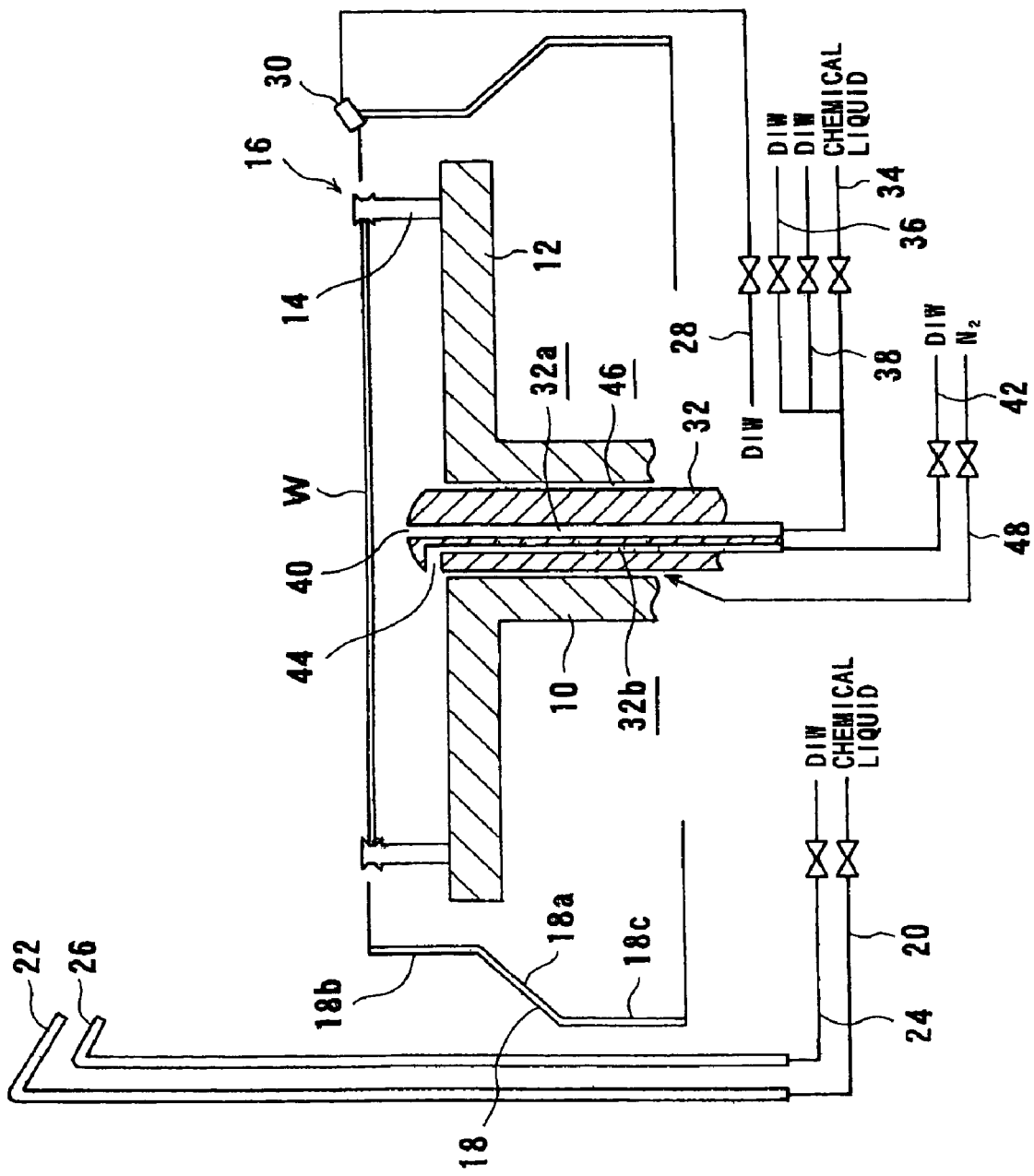
FIG. 3 is a schematic cross-sectional view of the substrate processing apparatus according to the embodiment of the present invention, with the scattering prevention cup in a cleaning position.

FIGS. 1 through 3 schematically show in cross section a substrate processing apparatus according to an embodiment of the present invention for processing a substrate with a chemical liquid, cleaning the processed substrate, and spin-drying the cleaned substrate with a single processing facility. As shown in FIGS. 1 through 3, the substrate processing apparatus has a substrate holder 16 for detachably holding a substrate W. The substrate holder 16 comprises a disk-shaped substrate stage 12 coupled to the upper end of a main shaft 10 that is rotatable about its own axis, and a plurality of substrate holding chucks 14 mounted in upstanding posture on the outer circumferential edge of an upper surface of the substrate stage 12 and angularly spaced at a predetermined interval or pitch along the outer circumferential edge. The substrate holder 16 is arranged to rotate in unison with the substrate W while holding the substrate W.

The substrate processing apparatus has a substantially cylindrical scattering prevention cup 18 vertically movably disposed around the substrate holder 16. The scattering prevention cup 18 has a tapered portion 18a whose diameter is progressively larger downwardly, a smaller-diameter portion 18b joined to the upper end of the tapered portion 18a, and a larger-diameter portion 18c joined to the lower end of the tapered portion 18a. The scattering prevention cup 18 is vertically movable between a lower substrate transfer position shown in FIG. 1 in which the substrate holder 16 is open sideways, an upper scattering prevention position shown in FIG. 2 in which the substrate holder 16 is circumferentially surrounded by the tapered portion 18a, and a cleaning position shown in FIG. 3, situated vertically between the substrate transfer position and the scattering prevention position, in which the substrate holder 16 is circumferentially surrounded by the smaller-diameter portion 18b.

When the scattering prevention cup 18 is positioned in the substrate transfer position shown in FIG. 1, the substrate W can freely be transferred between a robot hand or the like and the substrate holding chucks 14 of the substrate holder 16 without physical interference with the scattering prevention cup 18. When the scattering prevention cup 18 is positioned in the scattering prevention position shown in FIG. 2, a chemical liquid (substrate processing liquid) which treats the substrate W is blocked mainly by the tapered portion 18a and prevented from being scattered around. When the scattering prevention cup 18 is positioned in the cleaning position shown in FIG. 3, a cleaning liquid (substrate processing liquid) which cleans the substrate W is blocked by the smaller-diameter portion 18b, and flows down along the inner wall surface of the scattering prevention cup 18, thus cleaning the inner wall surface of the scattering prevention cup 18.

The substrate processing apparatus also has a chemical liquid supply nozzle 22 located in an upper position laterally of the substrate holder 16 and connected to a first chemical liquid supply line 20 for supplying the chemical liquid onto the upper surface of the substrate W that is being held by the substrate holder 16, and a first cleaning liquid supply nozzle 26 located in an upper position laterally of the substrate holder 16 connected to a first cleaning liquid supply line 24 for supplying the cleaning liquid onto the upper surface of the substrate W that is being held by the substrate holder 16.

The substrate processing apparatus also has a second cleaning liquid supply nozzle 30 in the form of a horizontally sectorial nozzle, for example, serving as a first substrate holder cleaner. The second cleaning liquid supply nozzle 30 is mounted on the upper end of the scattering prevention cup 18 and connected to a second cleaning liquid supply line 28 for supplying the cleaning liquid radially inwardly of the substrate holder 16 from a position outside of the substrate holder 16. When the scattering prevention cup 18 is positioned in the cleaning position shown in FIG. 3, the second cleaning liquid supply nozzle (first substrate holder cleaner) 30 supplies the cleaning liquid to the substrate holder 16 which is holding the substrate W to clean mainly the outer circumferential surface, which faces outwardly, of the substrate holder 16. Since the second cleaning liquid supply nozzle 30 is mounted on the scattering prevention cup 18, it can move vertically in unison with the scattering prevention cup 18 without the need for any dedicated mechanism for vertically moving the second cleaning liquid supply nozzle 30.

The main shaft 10 comprises a hollow shaft accommodating therein a fixed shaft 32 having a first liquid passage 32a and a second liquid passage 32b defined therein which extend vertically therethrough. The first liquid passage 32a has a lower end selectively connected to a second chemical liquid supply line 34, a third cleaning liquid supply line 36, or a fourth cleaning liquid supply line 38, and an upper end integrally combined with a first reverse side nozzle 40 which serves as a processing liquid supply nozzle for supplying chemical and cleaning liquids to the reverse side of the substrate W which is held by the substrate holder 16. The first reverse side nozzle 40 doubles as a processing liquid supply portion cleaner for cleaning the upper surface of the fixed shaft 32 that serves as a processing liquid supply portion. The first reverse side nozzle (a combination processing liquid supply nozzle and processing liquid supply portion cleaner) 40 doubles as the processing liquid supply portion cleaner by changing the flow rate of the cleaning liquid supplied therethrough selectively to two steps with supply valves which are interposed respectively in the third cleaning liquid supply line 36 and the fourth cleaning liquid supply line 38.

Rather than providing those plural liquid supply lines, a single cleaning liquid supply line may be provided, and the flow rate of the cleaning liquid supplied through the first reverse side nozzle 40 may be changed to two steps with a control valve interposed in the single cleaning liquid supply line.

The second liquid passage 32b has a lower end connected to a fifth cleaning liquid supply line 42 and an upper end integrally combined with a second reverse side nozzle 44 in the form of a horizontally sectorial nozzle, for example. The second reverse side nozzle 44 serves as a scattering prevention cup cleaner for cleaning the inner wall surface of the scattering prevention cup 18 and also as a second substrate holder cleaner for cleaning mainly the upper surface of the substrate stage 12 and outer circumferential surfaces, facing inwardly, of the substrate holding chucks 14 of the substrate holder 16. When the scattering prevention cup 18 is positioned in the cleaning position shown in FIG. 3, the second reverse side nozzle (a combination scattering prevention cup cleaner and second substrate holder cleaner) 44 supplies the cleaning liquid in a horizontally sectorial pattern onto the entire upper surface of the substrate stage 12 to clean the upper surface of the substrate stage 12 and outer circumferential surfaces, facing inwardly, of the substrate holding chucks 14. The cleaning liquid thus supplied to the upper surface of the substrate stage 12 is expelled toward the scattering prevention cup 18 under centrifugal forces and applied to the inner wall surface of the scattering prevention cup 18. The inner wall surface of the scattering prevention cup 18 is cleaned with the cleaning liquid when it flows down along the inner wall surface of the scattering prevention cup 18.

A fluid passage 46 is defined between the inner circumferential surface of the hollow main shaft 10 and the outer circumferential surface of the fixed shaft 32. The fluid passage 46 is connected to an inactive gas supply line 48 which supplies an inactive gas, such as an $N_2$ gas or the like. The inactive gas is blown through the fluid passage 46 toward the reverse side of the substrate W held by substrate holder 16 to prevent a negative pressure (a pressure lower than the atmospheric pressure) from being developed in the space between the substrate W that is being rotated at a high speed and the substrate stage 12.

Though the cleaning liquid supplied from the cleaning liquid supply lines 24, 28, 36, 38, 42 generally comprises DIW (de-ionized water or pure water) or gas-dissolved water, it may comprise a chemical liquid depending on the purpose for which it is used. In the illustrated embodiment, the cleaning liquid comprises DIW.

A sequence of processing the substrate W with the chemical liquid and cleaning liquid on the substrate processing apparatus will be described below with reference to a flowchart shown in FIG. 4.

When the scattering prevention cup 18 is positioned in the lower substrate transfer position shown in FIG. 1, the substrate W held by a robot hand or the like is received by the substrate holding chucks 14 of the substrate holder 16 in STEP 1. Then, the scattering prevention cup 18 is lifted to the upper scattering prevention position shown in FIG. 2 in STEP 2.

Then, the substrate W is rotated at a speed of 500 rpm, for example. The chemical liquid supply nozzle 22 supplies the chemical liquid to the surface of the substrate W, and at the same time, the first reverse side nozzle 40 supplies the chemical liquid to the reverse side of the substrate W, thereby processing the substrate W with the chemical liquid in STEP 3. The speed at which the substrate W is rotated at this time is selected to cause the supplied chemical liquid (substrate processing liquid) to spread over the surface of the substrate W. Any chemical liquid that is scattered outwardly of the substrate W at this time is blocked by the tapered portion 18a of the scattering prevention cup 18 that is positioned radially outwardly of the substrate W, and hence is prevented from being scattered outside of the scattering prevention cup 18.

After the face and reverse sides of the substrate W have been supplied with the chemical liquid for a predetermined period of time, the chemical liquid supply nozzle 22 stops supplying the chemical liquid, and the first cleaning liquid supply nozzle 26 supplies the DIW to the surface of the substrate W. Similarly, the first reverse side nozzle 40 stops supplying the chemical liquid, and then supplies the DIW through the third cleaning liquid supply line 36 to the reverse side of the substrate W. In this manner, the face and reverse sides of the substrate W are cleaned with pure water (DIW) in STEP 4.

Then, the rotational speed of the substrate W is reduced to 100 rpm, for example, after which the scattering prevention cup 18 is moved to the cleaning position shown in FIG. 3 which is situated vertically between the substrate transfer position and the scattering prevention position in STEP 5. At this time, the rotational speed of the substrate W is preferably in the range from 100 to 300 rpm in order to minimize splashing of the DIW on the inner wall surface of the scattering prevention cup 18.

After the movement of the scattering prevention cup 18 is completed, the second cleaning liquid supply nozzle (the first substrate holder cleaner) 30 supplies the DIW to the outer circumferential portion of the substrate holder 16 to clean mainly the outer circumferential surface, facing outwardly, of the substrate holding chucks 14 and the outer side surface of the substrate stage 12 of the substrate holder 16. Simultaneously, the second reverse side nozzle (the combination scattering prevention cup cleaner and second substrate holder cleaner) 44 supplies the DIW in a horizontally sectorial pattern onto the entire upper surface of the substrate stage 12 to clean the upper surface of the substrate stage 12 and also mainly the outer circumferential surfaces, facing inwardly, of the substrate holding chucks 14 of the substrate holder 16. The cleaning liquid thus supplied to the upper surface of the substrate stage 12 is expelled toward the scattering prevention cup 18 under centrifugal forces and applied to the inner wall surface of the scattering prevention cup 18. The inner wall surface of the scattering prevention cup 18 is cleaned with the cleaning liquid when it flows down along the inner wall surface of the scattering prevention cup 18 in STEP6. The first reverse side nozzle (combination processing liquid supply nozzle and processing liquid supply portion cleaner) 40 stops supplying the DIW through the third cleaning liquid supply line 36, and supplies the DIW through the fourth cleaning liquid supply line 38. The DIW is supplied through the fourth cleaning liquid supply line 38 in such an amount that the supplied DIW will not reach the reverse side of the substrate W held by the substrate holder 16. In this manner, the first reverse side nozzle 40 and upper surface of the fixed shaft 32 serving as the cleaning liquid supply portion are cleaned with the DIW.

After the substrate W has been cleaned with pure water (DIW) for a predetermined period of time, the scattering prevention cup 18 is moved back to the scattering prevention position shown in FIG. 2 in STEP 7.

Then, the second cleaning liquid supply nozzle (the first substrate holder cleaner) 30, the first reverse side nozzle (combination processing liquid supply nozzle and processing liquid supply portion cleaner) 40, and the second reverse side nozzle (the combination scattering prevention cup cleaner and second substrate holder cleaner) 44 stop supplying the DIW, and the rotational speed of the substrate W is increased to 2000 rpm, for example, to spin-dry the substrate W in STEP 8. If necessary, furthermore, the reverse side of the substrate W is supplied with an inactive gas such as an $N_2$ gas or the like to prevent a negative pressure (a pressure lower than the atmospheric pressure) from being developed in the space between the substrate W and the substrate stage 12.

By thus cleaning the inner wall surface of the scattering prevention cup 18, the upper and side surfaces of the substrate stage 12 of the substrate holder 16, and the substrate holding chucks 14 with the DIW supplied in STEP 6, the substrate W can be continuously spin-dried by the same apparatus without being affected by the chemical liquid.

After the substrate W has been spin-dried for a predetermined period of time, the rotation of the substrate W is stopped, finishing the processing of the substrate W. Then, the scattering prevention cup 18 is moved to the substrate transfer position shown in FIG. 1, where the processed substrate W is transferred from the substrate holder 16 to a robot hand or the like and transferred to a next process in STEP 9.

According to the present invention, as described above, before the substrate is dried, the inner wall surface of the scattering prevention cup 18 and other surfaces are cleaned to remove the substrate processing liquid such as the chemical liquid that has been applied to the inner wall surface and the other surfaces. Therefore, when the substrate is dried, the substrate is prevented from being contaminated by the substrate processing liquid that has been applied to the inner wall surface of the scattering prevention cup 18 and the other surfaces. The substrate can thus be processed through the successive steps including spin-drying the substrate with the single processing facility.

Although a certain preferred embodiment of the present invention has been shown and described in detail, it should be understood that various changes and modifications may be made therein without departing from the scope of the appended claims.

What is claimed is:

1. A method of processing a substrate, comprising:

processing a substrate with a substrate processing liquid and then cleaning a reverse side surface of the substrate with a cleaning liquid supplied from a first reverse side nozzle connected to a first cleaning liquid supply line while circumferentially surrounding the substrate, held by a substrate holder, with a tapered portion of a scattering prevention cup, wherein the diameter of the tapered portion is progressively larger in a downward direction of the scattering prevention cup so as to prevent the substrate processing liquid and the cleaning liquid supplied to the substrate from being scattered around;

lowering the scattering prevention cup until an upper surface of the scattering prevention cup lies substantially on the same plane as an upper surface of the substrate held by the substrate holder so as to circumferentially surround the substrate held by the substrate holder with a smaller-diameter portion that is connected to an upper end of the tapered portion of the scattering prevention cup;

cleaning the substrate which has been processed by the processing liquid; and horizontally supplying a cleaning liquid from a second reverse side nozzle connected to a second cleaning liquid supply line to the substrate holder in a direction toward the scattering prevention cup while rotating the substrate holder, so that the cleaning liquid from the reverse side nozzle cleans a substantially entire inner wall surface of the scattering prevention cup and an upper surface of the substrate holder.

* * * * *